United States Patent
Kim

(10) Patent No.: US 6,881,952 B2
(45) Date of Patent: Apr. 19, 2005

(54) RESIDUAL GAS ANALYZER OF SEMICONDUCTOR DEVICE MANUFACTURING EQUIPMENT

(75) Inventor: Seon-Woo Kim, Giheung-Eup (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/866,755

(22) Filed: Jun. 15, 2004

(65) Prior Publication Data

US 2005/0017168 A1 Jan. 27, 2005

(30) Foreign Application Priority Data

Jul. 23, 2003 (KR) ................................ 10-2003-0050460

(51) Int. Cl.[7] .......................... H01J 49/04; G01M 3/04
(52) U.S. Cl. ...................... 250/300; 250/281; 250/282; 250/299; 324/464
(58) Field of Search ................................ 250/300, 299, 250/282, 281, 288, 289, 441.11; 324/464; 73/40.7

(56) References Cited

U.S. PATENT DOCUMENTS

| | | | | |
|---|---|---|---|---|
| 4,911,103 A | * | 3/1990 | Davis et al. ................ 118/725 |
| 5,301,537 A | * | 4/1994 | Atkinson ........................ 73/40 |
| 5,490,413 A | * | 2/1996 | Atkinson ........................ 73/40 |
| 5,521,381 A | * | 5/1996 | Gregg et al. ................. 250/288 |
| 6,162,488 A | | 12/2000 | Gevelber et al. |
| 6,322,670 B1 | | 11/2001 | Cole et al. |
| 6,432,838 B1 | | 8/2002 | Choi et al. |
| 6,541,769 B1 | * | 4/2003 | Takada et al. ............... 250/290 |
| 6,674,068 B1 | * | 1/2004 | Kammei ..................... 250/287 |

* cited by examiner

*Primary Examiner*—John R. Lee
*Assistant Examiner*—Bernard E. Souw
(74) *Attorney, Agent, or Firm*—Volentine Francos & Whitt PLLC

(57) ABSTRACT

In semiconductor manufacturing equipment having a residual gas analyzing apparatus for analyzing the composition of residual gas in a process chamber of the equipment a heater of the residual gas analyzer is interlocked with a heater of the process chamber. The residual gas analyzer includes an ion detector, and the heater of the residual gas analyzer has a filament and a heating jacket surrounding a portion of the ion detector. A relay connects a power source of the heater for the process chamber to the heater of the residual gas analyzer. Power is supplied to and cut off from the heater of the residual gas analyzer in response to heater on/off signals used for controlling the operation for the heater for the process chamber.

4 Claims, 3 Drawing Sheets

RESIDUAL GAS ANALYZER OF SEMICONDUCTOR DEVICE MANUFACTURING EQUIPMENT

BACKGROUND OF THE INVENTION

1. Field of the Invention

The present invention relates to a chemical vapor deposition apparatus for use in manufacturing a semiconductor device. More particularly, the present invention relates to a gas analyzing apparatus for analyzing the residual gas in the reaction chamber of a chemical vapor deposition apparatus.

2. Description of the Related Art

A semiconductor device is generally manufactured by selectively and repeatedly subjecting a wafer to a number of processes such as photolithography, etching, diffusion, chemical vapor deposition, ion implantation and metal deposition processes. The etching, diffusion and chemical vapor deposition processes are performed by supplying a process gas into a sealed process chamber, and by providing an atmosphere in the chamber that facilitates a reaction between the process gas and the wafer. Accordingly, a gaseous by-product of the reaction, as well as unreacted/process gas, remain in the chamber as so-called residual gas at the end of the above-mentioned processes.

FIG. 1 illustrates a chemical vapor deposition apparatus for use in manufacturing a semiconductor device according to the prior art. The apparatus is provided with a residual gas analyzing apparatus for analyzing the residual gas in the process chamber.

Referring to FIG. 1, the process chamber 10 comprises an external tube 14 and an internal tube 16. Various kinds of processes, such as a plasma process, a diffusion process, or a chemical vapor deposition process, can be performed in the process chamber 10. A loadlock chamber 12 is disposed beneath the process chamber. A boat 18 accommodating several wafers to be processed is adapted to be driven by an elevator 20 upward and downward between the process chamber 10 and the loadlock chamber 12. A gas supply line 22 is connected to a bottom portion of the internal tube 16 of the process chamber 10 for supplying process or cleaning gas into the chamber. A valve 32 is installed in the gas supply line 22 for controlling the flow of gas through the gas supply line 22. Also, an $SiH_4$ supply source 24, a $PH_3$ supply source 26, an $N_2$ supply source 28 and a $ClF_3$ supply source 30 are connected to the gas supply line 22 via respective valves 32, 34, 36, 38, 40. On the other hand, waste gas left in the chamber 10 after the wafers are processed is exhausted through an exhaust pipe 42 using an exhaust pump 44. The waste gas is cleaned by a scrubber 46.

The chemical vapor deposition apparatus also has a system for analyzing the gas generated in the process chamber 10. The gas analyzing system includes a sampling port 48 connected to the external tube 14, and a sampling manifold 50 to which the sampling port 48 is connected by a flexible connector 52. A sampling pipe 54 of the sampling manifold is made of stainless material, has a ⅜ inch diameter, and is electro-polished. A first air valve 62, a second air valve 66, a first isolation valve 68, a second isolation valve 70, a third isolation valve 72 and a gate valve 74, are disposed in series along the sampling pipe 54. The first and second isolation valves 68, 70 each have an orifice of 100 microns in diameter, and the third isolation valve 72 has an orifice of 250 microns in diameter.

An $N_2$ supply source 56 is connected in the sampling manifold 50 to supply $N_2$ as a purge gas even while the sampling is not performed. A bifurcation 58 connects the $N_2$ supply source 56 to both the first air valve 62 and the second air valve 66. A CM gauge 76 is installed between the first isolation valve 68 and the second isolation valve 70. A line 78 diverges from the sampling pipe 54 at the location of the CM gauge 76, and is connected to the scrubber 46 via a sampling pump 90.

The downstream end of the sampling pipe 54, in which the gate valve 74 is disposed, is connected to a residual gas analyzer 80. The residual gas analyzer 80 is an RGA-QMS (Residual Gas Analyzer-Quadrupole Mass Spectrometer) comprising an ion detector made up of an a mass spectrometer 84 provided with an ion gauge 82. The mass spectrometer 84 is connected to the scrubber 46 through a turbo pump 86 and a baking pump 88. The $ClF_3$ gas from source 30 is used for cleaning polysilicon, silicon nitride, silicon glass and tungsten silicide, and can do so even in a low temperature state as opposed to while being in a plasma state. In particular, due to its extreme chemical selectivity, the $ClF_3$ gas can be used to etch portions of the wafer that can not be reached by plasma. The $ClF_3$ gas also has an advantage that it hardly generates any particles on the surface of the wafer.

When the apparatus is used to carry out an etch process, the lower the pressure in the process chamber, the more uniform the layer of material etched within the process chamber becomes. On the other hand, the process chamber 10 is preferably heated to a temperature greater than 400° C. to facilitate a satisfactory etching rate. This temperature is greater than that of the boiling point of $ClF_3$. The $ClF_3$ gas has a very strong reactivity and if the etching speed is too high, the tube itself is etched, whereby its thickness is reduced and its useful life is shortened. For this reason, the pipe for supplying the $ClF_3$ is made of nickel, monel, Hastelloy, stainless steel 316L or a polymer. Furthermore, condensation may occur and thus damage the vacuum system of the apparatus. Therefore, a control for the purge cycle or cleaning time is very important.

Meanwhile, a sample of the gas under use or remaining in the process chamber is ionized by the RGA-QMS by colliding the gas with electrons accelerated by an electric potential difference of 70 eV. A mass spectrum is obtained of the ions having a specific mass-to-charge ratio, as discriminated according to the magnitude of their voltage. The composition of the ions obtained in this way yields desired information of the gas present in the chamber 10. The RGA-MS is a movable system in the form of a CIS (Closed Ion Source) in which the ions exist under a differential vacuum, as opposed to an OIS (Open Ion Source) of the type that is generally employed by sputtering equipment. Accordingly, the RGA-MS can analyze a process gas in addition to bulk gas.

Also, the residual gas analyzer 80 of the chemical vapor deposition apparatus includes a heater 92 for the ion detector. The performance of that part of the ion detector fit contacted by the gas from the process chamber 10 can be degraded by impurities in the gas. Heating the ion detector, e.g., the gas inlet of the mass spectrometer, overcomes this problem. FIG. 2 illustrates a conventional residual gas analyzer that includes such a heater.

Referring to FIG. 2, the RGA 80 is provided with a heater 92 comprising a filament and a heating jacket. A power switch 94 is connected to the heater 92 and to a power source for selectively providing and cutting off the supply of power to the heater 92. The power switch 94 is operated by a technician.

The power source is used to operate the process chamber 10, e.g., to supply power to a heater of the process chamber 10, whereby a baking process is performed. A technician manipulates the power switch 94 after power is supplied by the power source to the process chamber 10.

However, the heater 92 can thus be turned on or off by the technician regardless of whether the process chamber 10 is being heated using the power from the power source. Thus, if the technician does not switch the power switch 94 on/off at an appropriate time, defects can be produced in the wafers that are being processed.

SUMMARY OF THE INVENTION

An object of the present invention is to provide a residual gas analyzing apparatus of semiconductor manufacturing equipment that operates in step with the process chamber of the equipment, whereby the composition of the residual gas is accurately detected and defects in the products being processed in the process chamber can be prevented.

Another object of the present invention is to provide a residual gas analyzing apparatus comprising a residual gas analyzer whose heater has a long useful life.

Still another object of the present invention is to provide semiconductor manufacturing equipment having a residual gas analyzer whose heater does not have to be operated by technicians. According to one aspect of the present invention, a residual gas analyzing apparatus includes an ion detector, a heater for heating the ion detector, a power source that supplies power to the heater, and an electronic relay connecting the power source to the heater. The relay is switchable on and off by electric control signals, namely, those used to control the heater of the process chamber from which the ion detector samples residual gas.

According to an aspect of the present invention, semiconductor manufacturing equipment incorporates such a residual gas analyzing apparatus. To this end, a controller is connected to the process chamber heater. The controller is operative to selectively generate a chamber heater ON signal and a chamber. OFF signal that control the operation of the process chamber heater. The relay is switchable on and off by the ON and OFF control signals issued by the controller, respectively, such that power from said power source is supplied to the heater of the residual gas analyzer only when the power is also being supplied to the process chamber heater and the relay is switched on. Conversely, the supply of power to the heater of the residual gas analyzer ceases automatically when the process chamber heater is turned off.

BRIEF DESCRIPTION OF THE DRAWINGS

These and other objects, features and advantages of the present invention will become better understood form the following detailed description of the preferred embodiments thereof made with reference tot the attached drawings, on which.

DETAILED DESCRIPTION OF THE PREFERRED EMBODIMENTS

Figure 1:
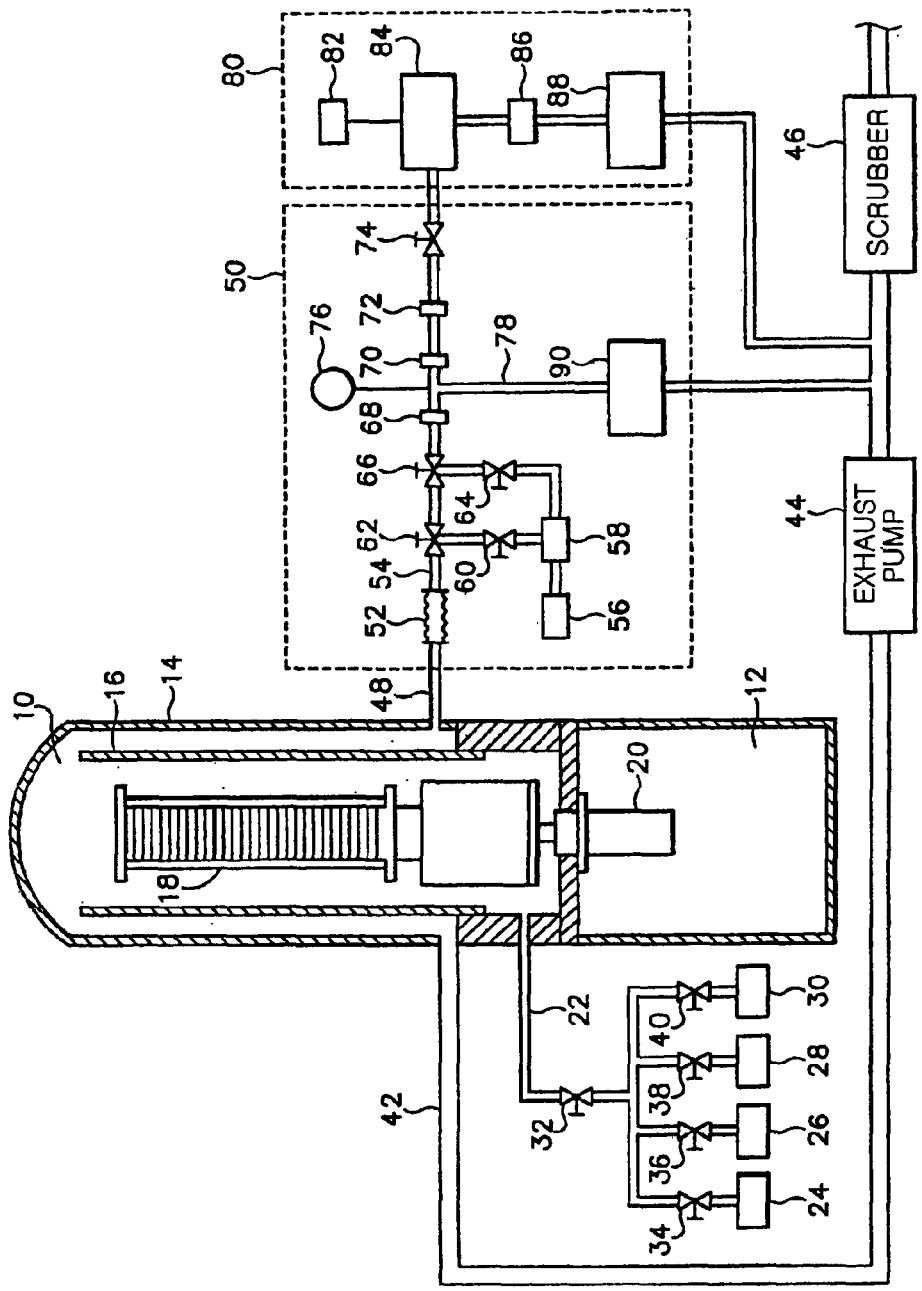
FIG. 1 is a sectional view of a chemical vapor deposition apparatus for use in manufacturing a semiconductor device according to the prior art.
Figure 2:
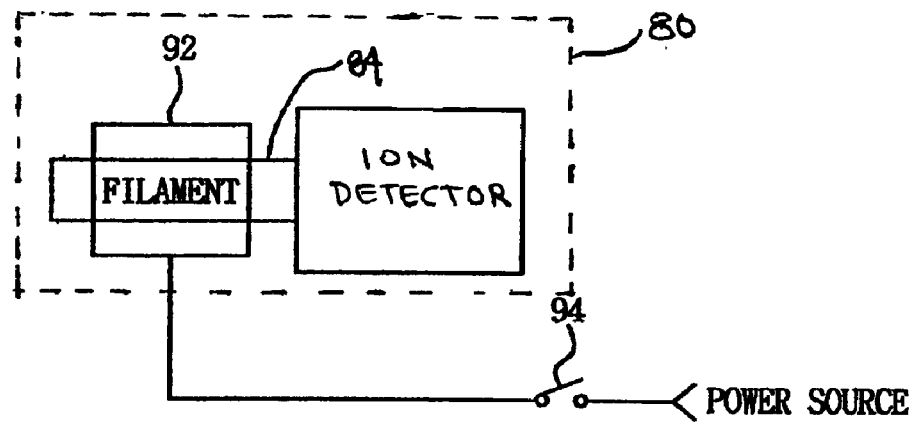
FIG. 2 is a schematic diagram of a residual gas analyzer according to the prior art.

The present invention will be described in detail with reference to FIGS. 3 and 4. It will be understood that many of the details of the present invention have already described in connection with the chemical vapor deposition apparatus shown in FIG. 1. Thus, a detailed description of the known functions and systems of the apparatus will not be repeated in the detailed description that follows.

Figure 3:
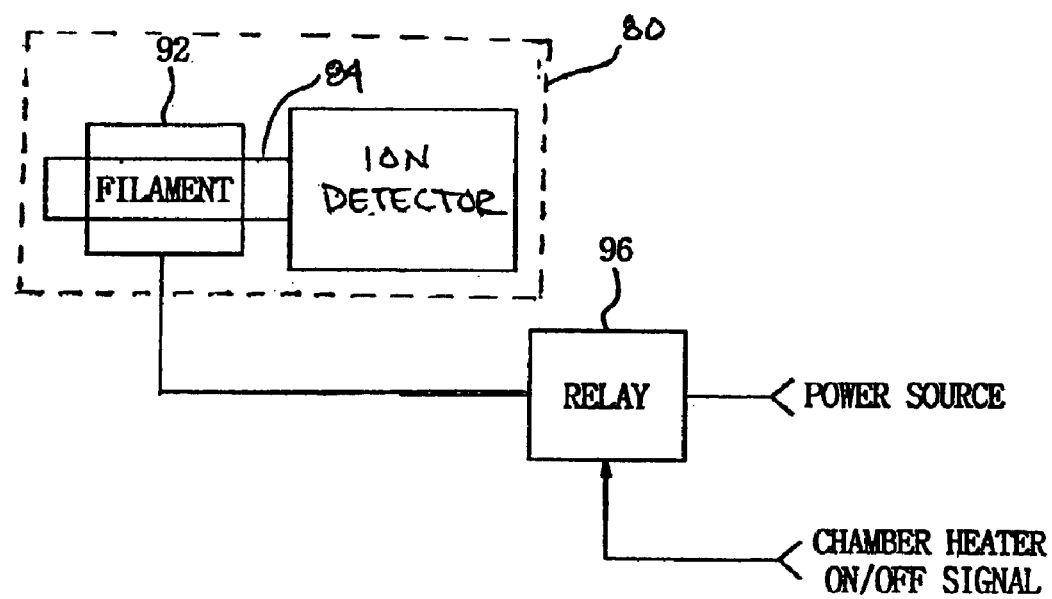
FIG. 3 is a schematic diagram of a residual gas analyzer according to the present invention.
Figure 4:
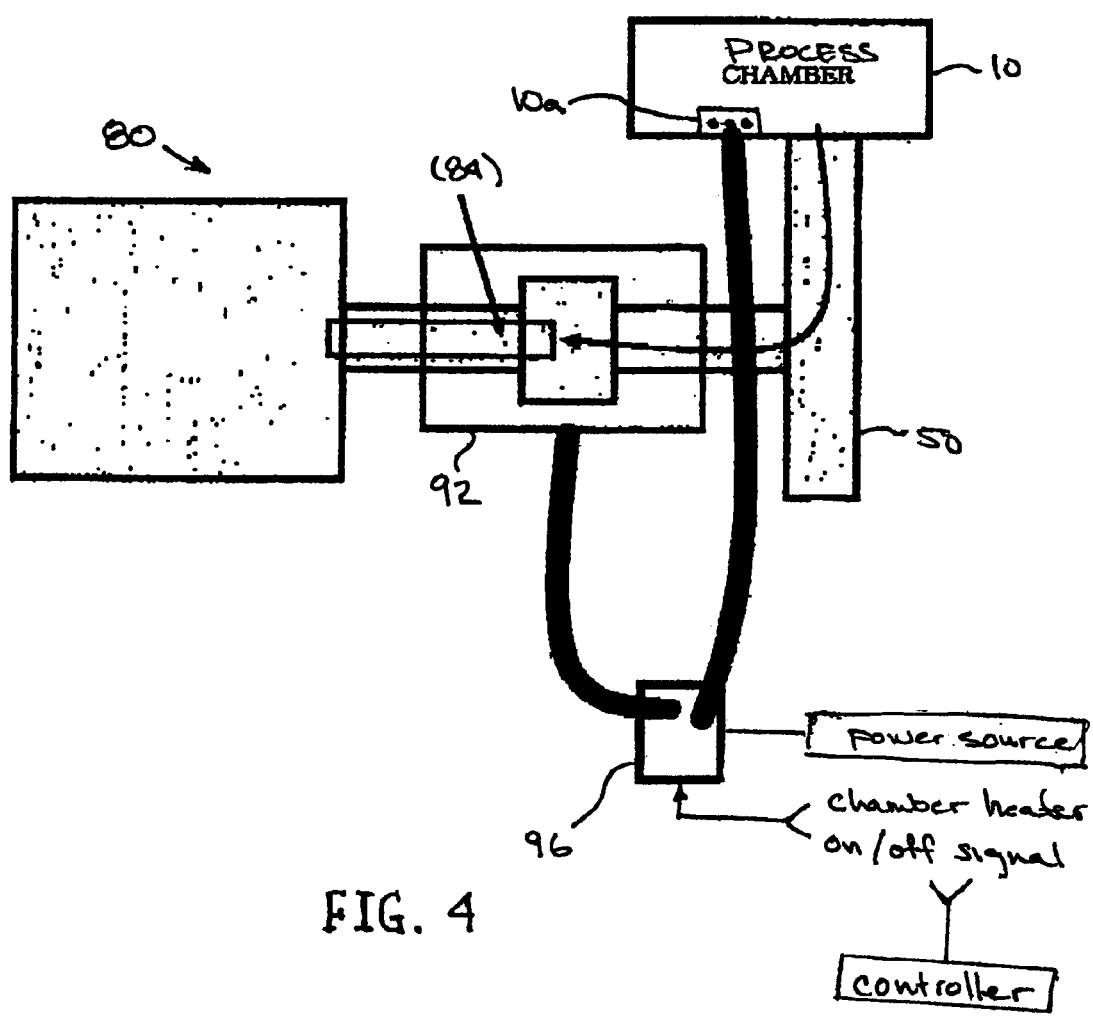
FIG. 4 is a schematic diagram of a chemical vapor deposition apparatus comprising the residual gas analyzer according to the present invention.

Turning now to FIGS. 3 and 4, the heating system of a residual gas analyzer 80 according to the present invention includes a heater 92, comprising a filament and a heating jacket, and a relay 96. The relay 96 operates in response to an on/off signal supplied to a process chamber 10 to initiate a baking process. The operation of the heating system will be described in more detail below.

The chemical vapor deposition apparatus has a main power source for operating the heater 10a of the process chamber 10. A chamber heater "on signal" is generated by a controller of the chemical vapor deposition apparatus when the power is supplied to the heater 10a of the process chamber 10. At this time, the relay 96 receives the chamber heater "on signal", whereupon the relay is switched on and the power source supplies power to the heater 92 of the RGA 80. When the baking process within the process chamber 10 is completed, a chamber heater "off signal" is issued by the controller to turn off the heater 10a of the process chamber 10. At this time, the relay 96 also receives the chamber heater "off signal" and is thus switched off. Accordingly, the supply of power from the power source to the heater 92 ceases.

As was described above, the heater of the residual gas analyzer of a chemical vapor deposition apparatus is turned on/off in response to a heater on/off signal of the process chamber of the apparatus. Therefore, the life of the heater can be extended. In addition, a technician is not required to operate the heater in step with the processes that are being carried out in the process chamber. That is, the present invention not only reduces the number of tasks required by the technician but also reduces the possibility of human error that could otherwise result in product defects.

Finally, it will be apparent to those skilled in the art that the above-described preferred embodiments of the present invention can be modified and varied without deviating from the true spirit or scope of the invention as defined by the appended claims.

What is claimed is:

1. A system for use in analyzing residual gas in semiconductor manufacturing equipment, having a process chamber heater comprising:

an ion detector operative to detect the composition of ions in a gas;

a heater disposed in a heat exchange relationship with said ion detector so as to heat said ion detector;

a power source that supplies power to said heater, and an electronic relay connecting said power source to said heater such that power from the power source is supplied to said heater only when the relay is switched on, said relay being switchable on and off by electric control signals, such that said relay is switched on only when said process chamber heater is turned on.

2. The system as claimed in 1, wherein said ion detector comprises a mass spectrometer having a gas inlet, and said heater comprises a filament disposed adjacent the gas inlet of said mass spectrometer.

3. Semiconductor manufacturing equipment comprising:

a process chamber;

a process chamber heater operatively associated with said process chamber so as to heat the interior of said process chamber when power is supplied thereto;

a power source that supplies power to said process chamber heater, a controller connected to said process chamber heater, said controller being operative to selectively generate a chamber heater ON signal and a chamber OFF signal that control the operation of said process chamber heater, a residual gas analyzer connected to said process chamber so as to receive a sample of gas from the interior of said chamber, said residual gas analyzer including an ion detector operative to detect the composition of ions in the gas, and a heater disposed in a heat exchange relationship with said ion detector so as to heat said ion detector, and an electronic relay connecting said power source to the heater of said residual gas analyzer, said relay being switchable on and off by the ON and OFF control signals issued by said controller, respectively, such that power from said power source is supplied to the heater of said residual gas analyzer only when power is being supplied to the process chamber heater and the relay is switched on, and the supply of power to the heater of the residual gas analyzer ceases only when the process chamber heater is turned off and the relay is switched off.

4. The semiconductor manufacturing equipment as claimed in 3, wherein the ion detector of said gas analyzer comprises a mass spectrometer having a gas inlet, and said heater comprises a filament disposed adjacent the gas inlet of said mass spectrometer.

* * * * *